US006849867B2

(12) United States Patent
Roberts et al.

(10) Patent No.: US 6,849,867 B2
(45) Date of Patent: Feb. 1, 2005

(54) METHOD OF MAKING RADIATION EMITTER DEVICES

(75) Inventors: John K. Roberts, East Grand Rapids, MI (US); Spencer D. Reese, Fort Wayne, IN (US)

(73) Assignee: Gentex Corporation, Zeeland, MI (US)

( * ) Notice: Subject to any disclaimer, the term of this patent is extended or adjusted under 35 U.S.C. 154(b) by 0 days.

(21) Appl. No.: 10/338,540

(22) Filed: Jan. 8, 2003

(65) Prior Publication Data

US 2003/0168670 A1 Sep. 11, 2003

Related U.S. Application Data

(60) Division of application No. 09/835,278, filed on Apr. 13, 2001, now Pat. No. 6,521,916, which is a continuation-in-part of application No. 09/426,795, filed on Oct. 22, 1999, now Pat. No. 6,335,548.
(60) Provisional application No. 60/265,489, filed on Jan. 31, 2001, and provisional application No. 60/124,493, filed on Mar. 15, 1999.

(51) Int. Cl.$^7$ .............................................. H01L 21/00
(52) U.S. Cl. .......................................... 257/25; 438/29
(58) Field of Search ............................ 257/99–100, 98; 438/22–29

(56) References Cited

U.S. PATENT DOCUMENTS

| 3,739,241 | A | | 6/1973 | Thillays |
| 3,920,495 | A | | 11/1975 | Roberts |
| 4,125,777 | A | | 11/1978 | O'Brien et al. |
| 4,247,864 | A | * | 1/1981 | Lockard ..................... 257/674 |
| 4,257,061 | A | | 3/1981 | Chapel, Jr. et al. |
| 4,267,559 | A | | 5/1981 | Johnson et al. |
| 4,394,600 | A | | 7/1983 | Flannagan |
| 4,729,076 | A | | 3/1988 | Masami et al. |
| 4,911,519 | A | | 3/1990 | Burton et al. |

(List continued on next page.)

FOREIGN PATENT DOCUMENTS

EP     0883195     12/1998

OTHER PUBLICATIONS

Cree Research, Inc., Spec. Sheet, "G–SiC® Technology Super Bright LEDs CXXX–CB290–E1000," revised May 1999, pp. 1–4.
Opto Technology, Inc., "New Products–High Output Blue, Green, and Red LED Illuminators," www.optotech.com website, Copyright 1998.
Hewlett–Packard, Inc., "Super Flux LEDs," Technical Data, Copyright 1998.

(List continued on next page.)

Primary Examiner—Nathan J. Flynn
Assistant Examiner—Leonardo Andújar
(74) Attorney, Agent, or Firm—Price, Heneveld, Cooper, DeWitt & Litton, LLP

(57) ABSTRACT

A radiation emitting device of the present invention includes at least one radiation emitter, first and second electrical leads electrically coupled to the radiation emitter, and an integral encapsulant configured to encapsulate the radiation emitter and a portion of the first and second electrical leads. The encapsulant has at least a first zone and a second zone, where the second zone exhibits at least one different characteristic from the first zone. Such different characteristics may be a physical, structural, and/or compositional characteristic. Preferably, the at least one different characteristic includes at least one of the following: mechanical strength, thermal conductivity, thermal capacity, coefficient of thermal expansion, specific heat, oxygen and moisture impermeability, adhesion, and transmittance with respect to radiation emitted from the radiation emitter. The radiation emitter may be in a form of an emitter, and is preferably an LED.

16 Claims, 9 Drawing Sheets

U.S. PATENT DOCUMENTS

| | | |
|---|---|---|
| 4,996,586 A | 2/1991 | Matsuda et al. |
| 5,032,898 A | 7/1991 | Bowen et al. |
| 5,060,027 A | 10/1991 | Hart et al. |
| 5,113,232 A | 5/1992 | Itoh et al. |
| 5,136,205 A | 8/1992 | Sokolich et al. |
| 5,173,839 A | 12/1992 | Metz, Jr. |
| 5,181,874 A | 1/1993 | Sokolich et al. |
| 5,235,347 A | 8/1993 | Lee |
| 5,291,039 A | 3/1994 | Ogata et al. |
| 5,434,750 A | 7/1995 | Rostoker et al. |
| 5,629,232 A | 5/1997 | Jiang |
| 5,629,389 A | 5/1997 | Roitman et al. |
| 5,656,823 A | 8/1997 | Kruangam |
| 5,680,008 A | 10/1997 | Brandes et al. |
| 5,753,928 A | 5/1998 | Krause |
| 5,770,428 A | 6/1998 | Boris-Lawrie |
| 5,777,433 A | 7/1998 | Lester et al. |
| 5,785,418 A | 7/1998 | Hochstein |
| 5,789,772 A | 8/1998 | Jiang |
| 5,825,794 A | 10/1998 | Ogino et al. |
| 5,841,177 A | 11/1998 | Komoto et al. |
| 5,869,883 A | 2/1999 | Mehringer et al. |
| 5,885,475 A | 3/1999 | Salyer |
| 5,929,557 A | 7/1999 | Makishima et al. |
| 5,940,683 A | 8/1999 | Holm et al. |
| 5,945,217 A | 8/1999 | Hanrahan |
| 5,952,680 A | 9/1999 | Strite |
| 5,958,100 A | 9/1999 | Farnworth et al. |
| 5,959,316 A | 9/1999 | Lowery |
| 5,966,393 A | 10/1999 | Hide et al. |
| 6,084,252 A | 7/2000 | Isokawa et al. |
| 6,274,924 B1 | 8/2001 | Carey et al. |
| 6,407,411 B1 | 6/2002 | Wojnarowski et al. |
| 6,518,600 B1 * | 2/2003 | Shaddock .................... 257/98 |

OTHER PUBLICATIONS

Opto Technology, Inc. Spec. Sheet, "High Power Red Illuminator," OTL68A–9–4–66–E, revised Jun. 1998.

Opto Technology, Inc. Spec. Sheet, "High Power White Illuminator–Preliminary," OTLWHTA–9–4–66–E, revised Aug. 1999.

Hewlett–Packard, Inc., "Using Super Flux LEDs in Automotive Signal Lamps," Application Note 1149–1, 1999.

Opto Technology, Inc. Spec. Sheet, "Very High Power IR Illuminator," OTL880B–9–4–66–E, revised May 1998.

DIEMAT Product Data Sheet, "DM6030Hk Ag EPOXY Adhesive Paste," May 11, 1999.

Epoxy Technology, "Products–Optical: Product Listing," www.epotek.com/optical listing.html website.

John K. Roberts (Gentex Corporation), "Binary Complementary Synthetic–White LED Illuminators," SAE Technical Paper Series, International Congress and Exposition, Detroit, Michigan, Mar. 1–4, 1999, pp. 1–17.

Hewlett–Packard, Inc., "LED Stop Lamps Help Reduce the Number and Severity of Automobile Accidents," Application Note 1155–3, Copyright 1998.

Advanced Thermoelectric Products, www.electracool.com/moduleworking.htm website—"The Basics," 1999.

Hewlett–Packard, Inc., "Thermal Management Considerations for Super Flux LEDs," Application Note 1149–4.

Hewlett–Packard, Inc., "Difference Between the SnapLED 150 and Super Flux/SnapLED Products," Application Note 1177. Copyright 1999.

Hewlett–Packard, Inc., "High–Flux LED," Technical Data, Copyright 1999.

Hewlett–Packard, Inc., "SnapLED 70 LEDs," Preliminary Technical Data, Copyright 1999.

* cited by examiner

METHOD OF MAKING RADIATION EMITTER DEVICES

CROSS-REFERENCE TO RELATED APPLICATIONS

This application is a divisional application of U.S. patent application Ser. No. 09/835,278, entitled "RADIATION EMITTER DEVICE HAVING AN ENCAPSULANT WITH DIFFERENT ZONES OF THERMAL CONDUCTIVITY," filed on Apr. 13, 2001, by John K. Roberts et al., now U.S. Pat. No. 6,521,916, which claims priority under 35 U.S.C. §119(e) on U.S. Provisional Patent Application No. 60/265,489, entitled "RADIATION EMITER DEVICES AND METHOD OF MAKING THE SAME," filed on Jan. 31, 2001, by John K. Roberts et al., and is a continuation-in-part of U.S. patent application Ser. No. 09/426,795, filed on Oct. 22, 1999, entitled "SEMICONDUCTOR RADIATION EMITTER PACKAGE," by John K. Roberts et al., now U.S. Pat. No. 6,335,548, which claims priority under 35 U.S.C. §119(e) on U.S. Provisional Patent Application No. 60/124,493, entitled "SEMICONDUCTOR RADIATION EMITTER PACKAGE," filed on Mar. 15, 1999, by John K. Roberts et al.

Priority under 35 U.S.C. §§ 120 and 119(e) is hereby claimed to each of the above applications. The entire disclosure of each of the above-noted applications is incorporated herein by reference.

BACKGROUND OF THE INVENTION

The present invention generally relates to radiation emitter devices such as, for example, light emitting diode (LED) packages, to methods of making radiation emitter devices, and to opto-electronic emitter assemblies incorporating optical radiation emitter devices.

As used herein, the term "discrete opto-electronic emitter assembly" means packaged radiation emitter devices that emit ultraviolet (UV), visible, or infrared (IR) radiation upon application of electrical power. Such discrete optoelectronic emitter assemblies include one or more radiation emitters. Radiation emitters, particularly optical radiation emitters, are used in a wide variety of commercial and industrial products and systems, and accordingly come in many forms and packages. As used herein, the term "optical radiation emitter" includes all emitter devices that emit visible light, near IR radiation, and UV radiation. Such optical radiation emitters may be photoluminescent, electroluminescent, or another type of solid state emitter. Photoluminescent sources include phosphorescent and fluorescent sources. Fluorescent sources include phosphors and fluorescent dyes, pigments, crystals, substrates, coatings, and other materials.

Electroluminescent sources include semiconductor optical radiation emitters and other devices that emit optical radiation in response to electrical excitation. Semiconductor optical radiation emitters include light emitting diode (LED) chips, light emitting polymers (LEPs), organic light emitting devices (OLEDs), polymer light emitting devices (PLEDs), etc.

Semiconductor optical emitter components, particularly LED devices, have become commonplace in a wide variety of consumer and industrial opto-electronic applications. Other types of semiconductor optical emitter components, including OLEDs, LEPs, and the like, may also be packaged in discrete components suitable as substitutes for conventional inorganic LEDs in many of these applications.

Visible LED components of all colors are used alone or in small clusters as status indicators on such products as computer monitors, coffee makers, stereo receivers, CD players, VCRs, and the like. Such indicators are also found in a diversity of systems such as instrument panels in aircraft, trains, ships, cars, trucks, minivans and sport utility vehicles, etc. Addressable arrays containing hundreds or thousands of visible LED components are found in moving-message displays such as those found in many airports and stock market trading centers and also as high brightness large-area outdoor television screens found in many sports complexes and in some urban billboards.

Amber, red, and red-orange emitting visible LEDs are used in arrays of up to 100 components in visual signaling systems such as vehicle center high mounted stop lamps (CHMSLs), brake lamps, exterior turn signals and hazard flashers, exterior signaling mirrors, and for roadway construction hazard markers. Amber, red, and blue-green emitting visible LEDs are increasingly being used in much larger arrays of up to 400 components as stop/slow/go lights at intersections in urban and suburban intersections.

Multi-color combinations of pluralities of visible colored LEDs are being used as the source of projected white light for illumination in binary-complementary and ternary RGB illuminators. Such illuminators are useful as vehicle or aircraft maplights, for example, or as vehicle or aircraft reading or courtesy lights, cargo lights, license plate illuminators, backup lights, and exterior mirror puddle lights. Other pertinent uses include portable flashlights and other illuminator applications where rugged, compact, lightweight, high efficiency, long-life, low voltage sources of white illumination are needed. Phosphor-enhanced "white" LEDs may also be used in some of these instances as illuminators.

IR emitting LEDs are being used for remote control and communication in such devices as VCR, TV, CD and other audio-visual remote control units. Similarly, high intensity IR-emitting LEDs are being used for communication between IRDA devices such as desktop, laptop, and palmtop computers; PDAs (personal digital assistants); and computer peripherals such as printers, network adapters, pointing devices ("mice," trackballs, etc.), keyboards and other computers. IR LED emitters and IR receivers also serve as sensors for proximity or presence in industrial control systems, for location or orientation within such opto-electronic devices such as pointing devices and optical encoders, and as read heads in such systems as barcode scanners. IR LED emitters may also be used in a night vision system for automobiles.

Blue, violet, and UV emitting LEDs and LED lasers arc being used extensively for data storage and retrieval applications such as reading and writing to high-density optical storage disks.

For discrete LED devices and other discrete ("packaged") opto-electronic emitters, increased performance is dependent substantially upon increased reliable package power capacity, reduced package thermal resistance, and reduced susceptibility of the package to damage during auto-insertion, soldering and other circuit or system manufacturing operations.

Keeping discrete opto-electronic emitters cool during operation enhances performance in several ways. The efficiency of the emitter usually decreases in relation to increased operating temperature and increases in relation to reduced operating temperature. Conversely, emitter efficiency typically increases in relation to reduced internal operating temperature. The reliability of the emitter and life of the materials and sub-components comprising it usually improves in relation to decreased operating temperature. The consistency of the emitter's emission spectra is usually improved in relation to decreased or more consistent operating temperature. The decay life of the emitter is usually improved in relation to reduced operating temperature. For these and other reasons, it is clearly beneficial to employ novel mechanisms for reducing the operating temperature of discrete opto-electronic emitters.

While the ambient environmental temperature is an external factor that cannot always be controlled, the temperature rise of the device above the ambient temperature is determined mainly by the device's thermal resistance and operating power.

Unfortunately, most discrete opto-electronic emitters exhibit a characteristic contravening to the goal of reduced internal operating temperature. In short, these types of devices usually emit greater amounts of useful radiation in proportion to increased power up to some practical limit of the package or constituent materials or subcomponents. Thus, for applications where more radiation is useful (i.e., almost all applications known), it is beneficial to drive the device at the highest power consistent with device and system reliability and consistent with the power-radiation characteristics of the device. However, increased power in devices with finite (positive, non-zero) thermal resistance results in elevated internal operating temperatures.

It would be advantageous then to reduce internal operating temperature without having to reduce device power, or alternately to maintain internal operating temperature while increasing device power. This can be accomplished by reducing the device thermal resistance.

Billions of LED components are used in applications such as those cited above, in part because relatively few standardized LED configurations prevail and due to the fact that these configurations are readily processed by the automated processing equipment used almost universally by the world's electronic assembly industries. Automated processing via mainstream equipment and procedures contributes to low capital cost, low defect rates, low labor cost, high throughput, high precision, high repeatability and flexible manufacturing practices. Without these attributes, the use of LEDs becomes cost prohibitive or otherwise unattractive from a quality standpoint for most high-volume applications.

Two of the most important steps in modern electronic assembly processes are high-speed automated insertion and mass-automated soldering. Compatibility with automatic insertion or placement machines and one or more common mass-soldering process are critical to large-scale commercial viability of discrete semiconductor optical emitters (including LEDs).

Thus, the vast majority of LEDs used take the form of discrete-packaged THD (Through Hole Device) or SMD (Surface Mount Device) components. These configurations primarily include radial-lead THD configurations known as "5 mm," "T-1," and "T-1¾" or similar devices with rectangular shapes, all of which are readily adapted onto tape-and-reel, tape-and-ammo, or other standardized packaging for convenient shipment, handling, and high-speed automated insertion into printed circuit boards on radial inserters. Other common discrete THD LED packages include axial components such as the "polyLED," which are readily adapted onto tape and reel for convenient shipment, handling, and high-speed automated insertion into printed circuit boards on axial inserters. Common SMD LED components such as the "TOPLED®" and Pixar are similarly popular as they are readily adapted into blister-pack reels for convenient shipment, handling, and high-speed automated placement onto printed circuit boards with chip shooters.

Soldering is a process central to the manufacture of most conventional circuit assemblies using standardized discrete electronic devices, whether THD or SMD. By soldering the leads or contacts of a discrete electronic component such as an LED to a printed circuit board, the component becomes electrically connected to electrically conductive traces on the PCB and also to other proximal or remote electronic devices used for supplying power to, controlling or otherwise interacting electronically with, the discrete electronic device. Soldering is generally accomplished by wave solder, IR reflow solder, convective IR reflow solder, vapor phase reflow solder, or hand soldering. Each of these approaches differ from one another, but they all produce substantially the same end effect—inexpensive electrical connection of discrete electronic devices to a printed circuit board by virtue of a metallic or inter-metallic bond. Wave and reflow solder processes are known for their ability to solder a huge number of discrete devices en masse, achieving very high throughput and low cost, along with superior solder bond quality and consistency.

Widely available cost-effective alternatives to wave solder and reflow solder processes for mass production do not presently exist. Hand soldering suffers from inconsistency and high cost. Mechanical connection schemes are expensive, bulky, and generally ill-suited for large numbers of electrical connections in many circuits. Conductive adhesives such as silver-laden epoxies may be used to establish electrical connections on some circuit assemblies, but these materials are more costly and expensive to apply than solder. Spot soldering with lasers and other selective-solder techniques are highly specialized for specific configurations and applications and may disrupt flexible manufacturing procedures preferred in automated electronic circuit assembly operations. Thus, compatibility with wave solder or reflow solder processes are desirable properties of a semiconductor optical emitter component. The impact of this property is far reaching, because these solder operations can introduce large thermal stresses into an electronic component sufficient to degrade or destroy the component. Thus an effective semiconductor optical emitter component must be constructed in such a fashion as to protect the device's encapsulation and encapsulated wire bonds, die attach and chip from transient heat exposure during soldering.

Conventional solder processes require that the ends of the leads of the device (below any standoff or at a point where the leads touch designated pads on the PCB) be heated to the melting point of the solder for a sustained period. This profile can include temperature excursions at the device leads as high as 230–300 degrees C. for as long as 15 seconds. Given that the leads of the device are normally constructed of plated metals or alloys such as copper or steel, this high temperature transient poses no problems for the leads themselves. The problem instead is the ability of these leads to conduct heat along their length into the encapsulated body of the device. Since these heated leads are in contact with the interior of the body of the device, they temporarily raise the local internal temperature of the device during solder processing. This can harm the somewhat delicate encapsulation, encapsulated wire bonds, die attach and chip. This phenomenon represents one of the fundamental limitations of low-cost, opto-electronic semiconductor devices today.

Keeping the body of an electronic component from rising excessively above the glass transition temperature of its encapsulating material during solder processing is critical, since the Coefficient of Thermal Expansion of polymer encapsulating materials rises dramatically above their glass transition points, typically by a factor of two or more. Polymers will increasingly soften, expand and plastically deform above their glass transition points. This deformation from polymer phase transition and thermal expansion in encapsulants can generate mechanical stress and cumulative fatigue severe enough to damage a discrete semiconductor device, resulting in poor performance of the device and a latent predisposition toward premature field failure. Such damage typically consists of: 1) fatigue or fracture of electrical wire bonds (at the chip bond pads or at the lead frame); 2) partial delamination or decomposition of die-attach adhesive; 3) micro-fracture of the chip itself; and 4) degradation of the device encapsulant, especially near the entry points of the leads into the encapsulant, and a compromised ability to seal out environmental water vapor, oxygen, or other damaging agents.

With regard to such thermal vulnerability, a crucial difference must be recognized between encapsulating materials suitable for non-optical electronic devices and those suitable for optical devices. The encapsulants used for non-optical devices may be opaque, whereas those used in constructing opto-electronic emitters and receivers must be substantially transparent in the operating wavelength band of the device. The side effects of this distinction are subtle and far ranging.

Since there is no need for transparency in non-optical devices, encapsulating materials for non-optical semiconductor devices may include a wide range of compositions containing a variety of opaque polymer binders, cross-linking agents, fillers, stabilizers and the like. Compositions of this type, such as heavily filled epoxy, may possess high glass transition temperatures ($T_g$), low thermal expansion coefficients ($C_{te}$), and/or elevated thermal conductivity such that they are suitable for transient exposures up to 175 degrees C. Opaque ceramic compositions may be thermally stable up to several hundred degrees C., with no significant phase transition temperatures to worry about, extremely low $C_{tc}$ and elevated thermal conductivity. For these reasons, exposure of conventional, opaque encapsulation materials for non-optical devices to electrical leads heated to 130 degrees C. or more for 10 seconds or so (by a solder wave at 230–300 degrees C.) is not normally a problem.

However, the need for optical transparency in encapsulants for opto-electronic emitters and receivers obviates use of most high-performance polymer-filler blends, ceramics and composites that are suitable for non-optical semiconductors. Without the presence of inorganic fillers, cross-linking agents or other opaque additives, the clear polymer materials used to encapsulate most opto-electronic devices are varieties of epoxies having relatively low $T_g$ values, greater $C_{tc}$, and low thermal conductivity. As such, they are not suitable for exposure to transient temperature extremes greater than about 130 degrees C., such as occurs during normal soldering.

To compensate for the potentially severe effects of damage from solder processing, prior art optoelectronic devices have undertaken a variety of improvements and compromises. The most notable improvement has been the relatively recent introduction of clear epoxies for encapsulation capable of enduring temperatures 10 to 20 degrees C. higher than those previously available (up to 130 degrees C. now versus the previous 110 degrees C.). While useful, this has only partially alleviated the problems noted—the newest materials in use still fall 50 degrees C. or more short of parity with conventional non-optical semiconductor encapsulation materials.

The most common compromise used to get around the transient temperature rise problem associated with soldering is to simply increase the thermal resistance of the electrical leads-used in the device construction. By increasing the thermal resistance of these solderable leads, the heat transient experienced within the device body during soldering is minimized. Such an increase in thermal resistance can typically be accomplished in the following manner without appreciably affecting the electrical performance of the leads: 1) using a lead material with lower thermal conductivity (such as steel); 2) increasing the stand-off length of the leads (distance between solder contact and the device body); or 3) decreasing the cross-sectional area of the leads.

Using these three techniques, prior art devices have been implemented with elevated thermal resistance of the electrical leads to provide the desired protection from the solder process.

While effective at protecting prior art devices from thermal transients associated with soldering, there are limits to this approach, particularly in the application of high power semiconductor opto-electronic emitters. Increased lead thermal resistance results in elevated internal operating temperatures in prior art devices, severely compromising operational performance and reliability of these devices. The soldered electrical leads of most prior art LED devices conduct power to the device and serve as the primary thermal dissipation path for heat created within the device during operation. Thus the electrical leads in prior art devices must be configured to possess thermal resistance as low as possible to facilitate heat extraction during normal operation. Radiation and natural convection from prior art devices play only a minor role in transferring internal heat to ambient, and thermal conduction through their encapsulating media is severely impeded by the low thermal conductivity of the optical materials used. Therefore, the electrically and thermally conductive metal leads must extract a majority of the heat to ambient by the mechanism of conduction. Greater thermal resistance in the solderable pins of these devices, necessary to protect the device from the transient thermal effects of soldering operations, therefore causes a higher internal temperature rise within the encapsulated device body during operation.

The maximum temperature rise of a portion of the device body in contact with the semiconductor emitter under steady state is approximately equal to the product of the power dissipation of the emitter and the thermal resistance between the emitter and the ambient environment.

As previously discussed, severe consequences will result if the device internal temperature rises substantially above the encapsulant $T_g$ value. Above this temperature, the $C_{tc}$ of the encapsulant typically increases very rapidly, producing great thermo-mechanical stress and cumulative fatigue at the LED wire bond and die attach. For most mobile applications such as automobiles, aircraft and the like, ambient temperatures commonly reach 80 degrees C. With encapsulation maximum operating temperatures in the range of 130 degrees C., an opto-electronic emitter for these applications must therefore limit its operational $\Delta T$ to an absolute maximum of about 50 degrees C. This limits the power that can be dissipated in a given component, and in turn limits the current that may be passed through the component. Since the emitted flux of semiconductor optical emitters are typically proportional to the electrical current passed through them, limitations upon maximum electrical current also create limitations on flux generated.

Thus, it would be advantageous to reduce internal operating temperature without having to reduce device power, or alternately to maintain internal operating temperature while increasing device power by means of reducing the device thermal resistance without increasing device vulnerability to transient thermal processing damage from soldering.

Other prior art devices have avoided these constraints, but have achieved high performance only by ignoring the needs of standardized, automated electronic assembly operations and adopting configurations incompatible with these processes. Still other prior art devices have achieved high performance by employing unusually expensive materials, sub-components, or processes in their own construction.

For example, one prior art approach that has been used to overcome these limitations uses hermetic semiconductor packaging, hybrid chip-on-board techniques, exotic materials such as ceramics, KOVAR and glass, or complex assemblies instead of or in addition to polymer encapsulation. While relevant for certain high-cost aerospace and telecommunications applications (where component cost is not a significant concern), such devices require expensive materials and unusual assembly processes. This results in high cost and restricted manufacturing capacity—both of which effectively preclude the use of such components in mass-market applications. The devices disclosed in U.S. Pat. No. 4,267,559 issued to Johnson et al. and U.S. Pat. No. 4,125,777 issued to O'Brien et al. illustrate good examples of this.

The Johnson et al. patent discloses a device which includes both a TO-18 header component and a heat coupling means for mounting an LED chip thereto and transferring internally generated heat to external heat dissipating means. The header consists of several components, including a KOVAR member, insulator sleeves and electrical posts, and is manufactured in a specialized process to ensure that the posts are electrically insulated as they pass through the header. The heat coupling means is a separate component from the header and is composed of copper, copper alloys, aluminum or other high thermal conductivity materials. According to the teachings of Johnson et al., the KOVAR header subassembly and copper heat coupling means must be bonded together with solder or electrically conductive adhesive for electrical continuity, allowing flow of electrical current into the heat coupling means and subsequently into the LED chip. Furthermore, the header and heat coupling means of the Johnson et al. patent are made of completely dissimilar materials and must be so because of their unique roles in the described assembly. The header must be made of KOVAR in order that it may have a similar coefficient of thermal expansion to the insulator sleeves that run through it. At least one such sleeve is necessary to electrically isolate electrical pins from the header itself. However, KOVAR has relatively low thermal conductivity, necessitating the inclusion of a separate heat coupling means made of a material such as copper with a higher thermal conductivity. Since the header is a complex subassembly itself and is made of different materials than the heat coupling means, it must be made separately from the heat coupling means and then later attached to the heat coupling means with solder or an electrically conductive adhesive.

LED devices made similarly to the teachings of the Johnson et al. patent are currently being marketed in specialized forms similar to a TO-66 package. These devices are complex and typically involve insulated pin and header construction and/or include specialty subcomponents such as ceramic isolation sheets within them.

Another approach which has been used to avoid damage to optoelectronic emitters from soldering has been to prohibit soldering of the component altogether or to otherwise require use of laser spot soldering or other unusual electrical attachment method. This can allow construction of a device with low thermal resistance from the semiconductor emitter within to the electrical pins without danger of device damage from soldering operations. The SnapLED 70 and SnapLED 150 devices made by Hewlett Packard illustrate this approach. In these devices, electrical connections are made to circuitry by mechanically stamping the leads to a simple metal circuit rather than soldering. The resultant devices are capable of continuous power dissipation as high as 475 mW at room temperature. This configuration, however, may complicate integration of such components with electronic circuits having higher complexity—such circuits are conventionally made using printed circuit boards, automated insertion equipment, and wave or reflow solder operations.

A final approach is illustrated by an LED package called the SuperFlux package (also known as the "Piranha"), available from Hewlett Packard. The SuperFlux device combines moderate thermal resistance between the encapsulated chip and the solder standoff on the pins with a high-grade optical encapsulant and specialized chip materials and optical design. It achieves a moderate power dissipation capability without resorting to a non-solderable configuration such as the SnapLED. However, there are several significant problems with this configuration that inhibit its broader use.

The package geometry of the SuperFlux package renders it incompatible with conventional high-speed THD radial or axial insertion machinery or by SMT chip shooters known to the present inventors. Instead, it must be either hand-placed or placed by expensive, slow, robotic odd-form insertion equipment. The SuperFlux package geometry is configured for use as an "end-on" source only—no readily apparent convenient lead-bend technique can convert this device into a 90-degree "side-looker" source. The moderate thermal resistance of the solderable pins of this device and relatively low heat capacity may leave it vulnerable to damage from poorly controlled solder processes. It may be inconvenient or costly for some electronic circuit manufacturers to control their soldering operations to the degree needed for this configuration. Finally, there is no convenient mechanism known to the inventors to outfit a SuperFlux package with a conventional active or passive heat sink.

A principle factor impeding further application of these and other LED devices in signaling, illumination and display applications is that there is not currently available a device that has a high power capability with high emitted flux where the device is easily adaptable to automated insertion and/or mass-soldering processes. These limitations have either impeded the practical use of LEDs in many applications requiring high flux emission, or they have mandated the use of arrays of many LED components to achieve desired flux emission.

Conventional "5 mm" or "T 1¾" devices have a high thermal resistance, typically in excess of 240 degrees C. per watt and usually are limited by clear encapsulation materials that lead to unreliability if the emitter in the device is operated continuously, routinely or cyclically above 130 degrees C. (less for any but the best materials clear available). With typical ambient temperatures commonly exceeding 85 degrees C. in the automotive environment, the temperature rise in these devices must be limited to 45 degrees C. in order to properly avoid these material limits. This means that the device power must be limited to approximately 0.18 W. With a reasonable design tolerance of 33 percent to accommodate manufacturing variances, the practical reliable power limit of this device must be approximately 0.12 W. This is not a lot of power, and the emitted flux of these devices is thus limited. To overcome this, many of these devices are often used in combination to produce the luminous or radiant flux needed for an application (e.g., up to 50 for an automotive CHSML, up to 400 for a traffic signal lamp).

Hewlett Packard's SuperFlux or Piranha devices have a lower thermal resistance than "5 mm" or "T 1¾" devices, typically around 145 degrees C. per watt. As with "5 mm" or "T 1¾" devices, SuperFlux or Piranha devices usually are limited by clear encapsulation materials that lead to unreliability if the emitter in the device is operated continuously, routinely, or cyclically above 130 degrees C. (less for any but the best materials clear available). With typical ambient temperatures commonly exceeding 85 degrees C. in the automotive environment, the temperature rise in these devices must be limited to 45 degrees C. in order to properly avoid these material limits. This means that the device power must be limited to approximately 0.3 W. Because these devices are attached subsequently with thermally stressful wave or other solder operations, and because their thermal resistance from lead to junction is reduced, they are more susceptible to damage during processing into circuits. Thus, a higher design tolerance of 40 percent should be used to accommodate manufacturing variances and increased susceptibility, and the practical reliable power limit of this device must be approximately 0.18 W. This is a substantial increase (33 percent) compared to "5 mm" or "T 1¾" devices, it still is not a lot of power and the emitted flux of these devices is thus also limited. To overcome this, many of these devices are often used in combination to produce the luminous or radiant flux needed for an application (e.g., up to 30 for an automotive CHSML).

Hewlett Packard's SnapLED devices have a lower thermal resistance than "5 mm" or "T 1¾" or SuperFlux or Piranha devices, as low as 100 degrees C. per watt. As with "5 mm" or "T 1¾" or SuperFlux, Piranha, or SnapLED devices usually are limited by clear encapsulation materials that lead to unreliability if the emitter in the device is operated continuously, routinely, or cyclically above 130 degrees C. (less for any but the best materials clear available). With typical ambient temperatures commonly exceeding 85 degrees C. in the automotive environment, the temperature rise in these devices must be limited to 45 degrees C. in order to properly avoid these material limits. This means that the device power must be limited to approximately 0.45 W. As noted above, because the thermal resistance of these devices from lead to junction is so low, they cannot be soldered by conventional means without being damaged. This severely limits their utility, but they still are suitable for some applications. Because these devices are attached subsequently with mechanically stressful clinching operations, they remain susceptible to damage during processing operations. Thus, a higher design tolerance of 40 percent should be used to accommodate manufacturing variances and potentially increased processing damage susceptibility, and the practical reliable power limit of this device must be approximately 0.27 W. This is a significant increase compared to "5 mm" or "T 1¾" or SuperFlux or Piranha devices, but it still is not a lot of power (and is achieved at a sacrifice in conventional solderability). To overcome the resulting limited flux from these devices, many are often used in combination to produce the luminous or radiant flux needed for an application (e.g., up to 12 for an automotive CHSML and up to 70 for an automotive rear combination stop/turn/tail lamp).

Surface mount devices such as the TOPLED®, PLCC and Hewlett Packard's "High-Flux" or "Barracuda" devices use dissimilar polymer materials in their construction, the first in order of assembly being a plastic material that forms the basic structure of the device body and holds the device leads together. However, this approach requires that the lead frames be processed initially via insert molding (to emplace the first supporting material around the lead frame), then die mounting, then wire bonding and then a second stage of molding. The second stage of molding must be the optical molding (to first provide an opportunity for die bonding and wire bonding). Such a design and process are difficult and expensive to execute with high yield and high quality. Accumulated variances would be excessive from the multistage molding scheme, interrupted by die and wire bonding.

An additional problem faced by designers of conventional LED devices is that the wire bond used to join one of the LED leads to the LED chip can break or lose contact with the lead or the chip. Such failure can occur, for example, due to shear forces that are transferred to the wire bond through the encapsulant or thermal expansion/contraction of the encapsulant around the wire bond.

The other forms of radiation emitters mentioned above also experience performance degradation, damage, increased failure probability, or accelerated decay if exposed to excessive operating temperatures.

Consequently, it is desirable to provide a radiation emitter device that has the capacity for higher emission output than conventional LED devices while being less susceptible to failure due to a break in the wire bond contact or other defect that may be caused by excessive operating temperatures.

Additionally, it is desirable to provide a radiation emitter device having improved emission output over that of conventional LED devices while retaining the same size and shape of the conventional LED devices so as to facilitate the immediate use of the inventive LED devices in place of the conventional LED devices while also requiring minimal modification to the apparatuses that are used to manufacture the LED devices.

SUMMARY OF THE INVENTION

Accordingly, it is an aspect of the present invention to provide a radiation emitter device that overcomes the above-noted problems and that provides improved performance and less vulnerability to fatal damage. According to one embodiment of the present invention, a radiation emitting device comprises at least one radiation emitter, first and second electrical leads electrically coupled to the radiation emitter, and an integral encapsulant configured to encapsulate the radiation emitter and a portion of the first and second electrical leads. The encapsulant has at least a first zone and a second zone. The second zone exhibits at least one different characteristic from the first zone. The different characteristic may be a physical, structural, and/or compositional characteristic. For example, the at least one different characteristic may include at least one or more of the following: mechanical strength, thermal conductivity, thermal capacity, specific heat, coefficient of thermal expansion, adhesion, oxygen impermeability, moisture impermeability, and transmittance for radiation emitted from the radiation emitter.

A method of making a radiation emitting device according to the present invention comprises the steps of (1) attaching and electrically coupling at least one radiation emitter to a lead frame to form a subassembly; (2) inserting the subassembly into a mold cavity; (3) partially filling the mold cavity with a first encapsulant material; (4) filling the remainder of the mold cavity with a second encapsulant material; and (5) removing the encapsulated subassembly from the mold cavity.

For a wide range of otherwise-conventional discrete optoelectronic emitters, the present invention accomplishes a significant increase in the reliable package power capacity and accomplishes significant reductions in the package thermal resistance and package damage susceptibility in novel ways.

These and other features, advantages, and objects of the present invention will be further understood and appreciated by those skilled in the art by reference to the following specification, claims, and appended drawings.

DETAILED DESCRIPTION OF THE PREFERRED EMBODIMENTS

Figure 1:
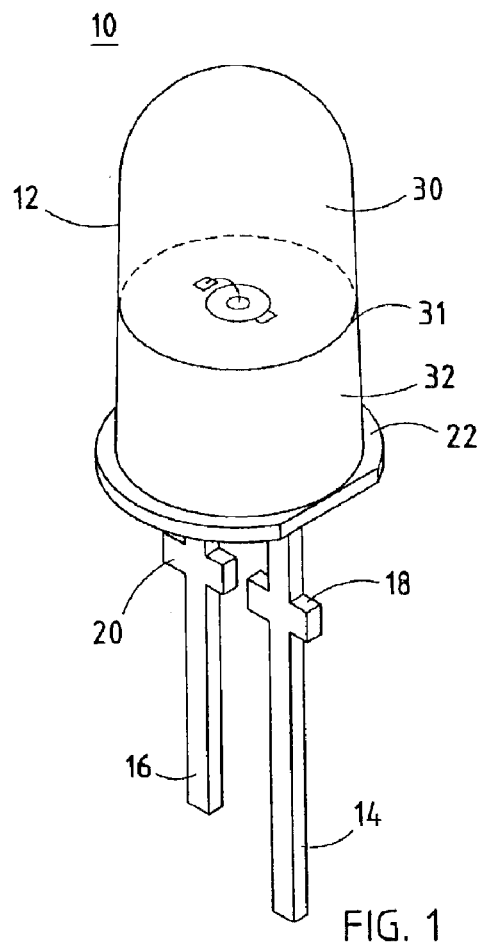
FIG. 1 is a perspective view of a radiation emitter device constructed in accordance with a first embodiment of the present invention.

Reference will now be made in detail to the present preferred embodiments of the invention, examples of which are illustrated in the accompanying drawings. Wherever possible, the same reference numerals will be used throughout the drawings to refer to the same or like parts.

For purposes of description herein, the terms "upper," "lower," "right," "left," "rear," "front," "vertical," "horizontal," "top," "bottom," and derivatives thereof shall relate to the invention as viewed by a person looking directly at the radiation emitting device along the principal optical axis of the source. However, it is to be understood that the invention may assume various alternative orientations, except where expressly specified to the contrary. It is also to be understood that the specific device illustrated in the attached drawings and described in the following specification is simply an exemplary embodiment of the inventive concepts defined in the appended claims. Hence, specific dimensions, proportions, and other physical characteristics relating to the embodiment disclosed herein are not to be considered as limiting, unless the claims expressly state otherwise.

Several embodiments of the present invention generally relate to an improved optical radiation emitting device useful in both high and low power applications. Such embodiments of the present invention are particularly well suited for use in limited power applications such as vehicles, portable lamps, and specialty lighting. By vehicles, we mean over-land vehicles, watercraft, aircraft and manned spacecraft, including but not limited to automobiles, trucks, vans, buses, recreational vehicles (RVs), bicycles, motorcycles and mopeds, motorized carts, electric cars, electric carts, electric bicycles, ships, boats, hovercraft, submarines, airplanes, helicopters, space stations, shuttlecraft, and the like. By portable lamps, we mean camping lanterns, head or helmet-mounted lamps such as for mining, mountaineering, and spelunking, hand-held flashlights, and the like. By specialty lighting we mean emergency lighting activated during power failures, fires or smoke accumulations in buildings, microscope stage illuminators, billboard frontlighting, backlighting for signs, etc. The light emitting assembly of the present invention may be used as either an illuminator or an indicator. Examples of some of the applications in which the present invention may be utilized are disclosed in commonly assigned U.S. Pat. No. 6,441,943 entitled "INDICATORS AND ILLUMINATORS USING A SEMICONDUCTOR RADIATION EMITTER PACKAGE," filed on Oct. 29, 2000, by J. Roberts et al., the entire disclosure of which is incorporated herein by reference.

Some of the embodiments of the present invention provide a highly reliable, low-voltage, long-lived, light source for vehicles, portable lighting, and specialty lighting capable of producing white light with sufficient luminous intensity to illuminate subjects of interest well enough to be seen and to have sufficient apparent color and contrast so as to be readily identifiable. Several of the radiation emitter devices of the present invention may be well suited for use with AC or DC power sources, pulse-width modulated DC power sources, and electronic control systems. The radiation emitting devices of the present invention may further be used to emit light of various colors and/or to emit non-visible radiation such as IR and UV radiation.

As used herein, the term "radiation emitter" and "radiation emitting device" shall include any structure that generates and emits optical or non-optical radiation, while the term "optical radiation emitter" or "optical radiation emitting device" includes those radiation emitters that emit optical radiation, which includes visible light, near infrared (IR) radiation, and/or ultraviolet (UV) radiation. As noted above, optical radiation emitters may include electroluminescent sources or other solid-state sources and/or photoluminescent or other sources. One form of electroluminescent source includes semiconductor optical radiation emitters. For purposes of the present invention, "semiconductor optical radiation emitters" comprise any semiconductor component or material that emits electromagnetic radiation having a wavelength between 100 nm and 2000 nm by the physical mechanism of electroluminescence, upon passage of electrical current through the component or material. The principle function of a semiconductor optical radiation emitter within the present invention is the conversion of conducted electrical power to radiated optical power. A semiconductor optical radiation emitter may include a typical IR, visible or UV LED chip or die well known in the art and used in a wide variety of prior art devices, or it may include any alternate form of semiconductor optical radiation emitter as described below.

Alternate forms of semiconductor optical radiation emitters which may be used in the present invention are light emitting polymers (LEPs), polymer light emitting diodes (PLEDs), organic light emitting diodes (OLEDs), and the like. Such materials and opto-electronic structures made from them are electrically similar to traditional inorganic LEDs, but rely on organic compositions such as derivatives of the conductive polymer polyaniline for electroluminescence. Such semiconductor optical radiation emitters are relatively new, but may be obtained from sources such as Cambridge Display Technology, Ltd. of Cambridge, and from Uniax of Santa Barbara, Calif.

For brevity, the term semiconductor optical radiation emitter may be substituted with the term LED or the alternate forms of emitters described above or known in the art. Examples of emitters suitable for the present invention include varieties of LED chips with associated conductive vias and pads for electrical attachment and that are emissive principally at P-N or N-P junctions within doped inorganic compounds of AlGaAs, AlInGaP, GaAs, GaP, InGaN, AlInGaN, GaN, SiC, ZnSe and the like.

LEDs are a preferred electroluminescent light source for use in the radiation emitting devices of the present invention because LEDs do not suffer appreciable reliability or field-service life degradation when mechanically or electronically switched on and off for millions of cycles. The luminous intensity and illuminance from LEDs closely approximates a linear response function with respect to applied electrical current over a broad range of conditions, making control of their intensity a relatively simple matter. Finally, recent generations of AlInGaP, AlGaAs, InGaN, AlInGaN, and GaN LEDs draw less electrical power per lumen or candela of visible light produced than incandescent lamps, resulting in more cost-effective, compact, and lightweight illuminator wiring harnesses, fuses, connectors, batteries, generators, alternators, switches, electronic controls, and optics. A number of examples have previously been mentioned and are incorporated within the scope of the present invention, although it should be recognized that the present invention has other obvious applications beyond the specific ones mentioned which do not deviate appreciably from the teachings herein and therefore are included in the scope of this invention.

Another preferred radiation source that may be used in the inventive light emitting assembly is a photoluminescent source. Photolurninescent sources produce visible light by partially absorbing visible or invisible radiation and re-emitting visible radiation. Photoluminescent sources are phosphorescent and fluorescent materials, which include fluorescent dyes, pigments, crystals, substrates, coatings, as well as phosphors. Such a fluorescent or phosphorescent material may be excited by an LED or other radiation emitter and may be disposed within or on an LED device, or within or on a separate optical element, such as a lens or diffuser that is not integral with an LED device. Exemplary. structures using a fluorescent or phosphorescent source are described further below.

Figure 2:
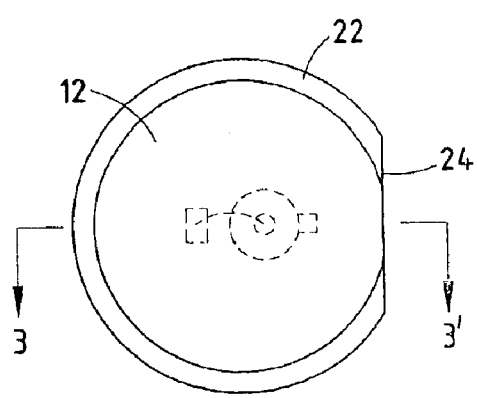
FIG. 2 is a top view of the radiation emitter device shown in FIG. 1.
Figure 3:
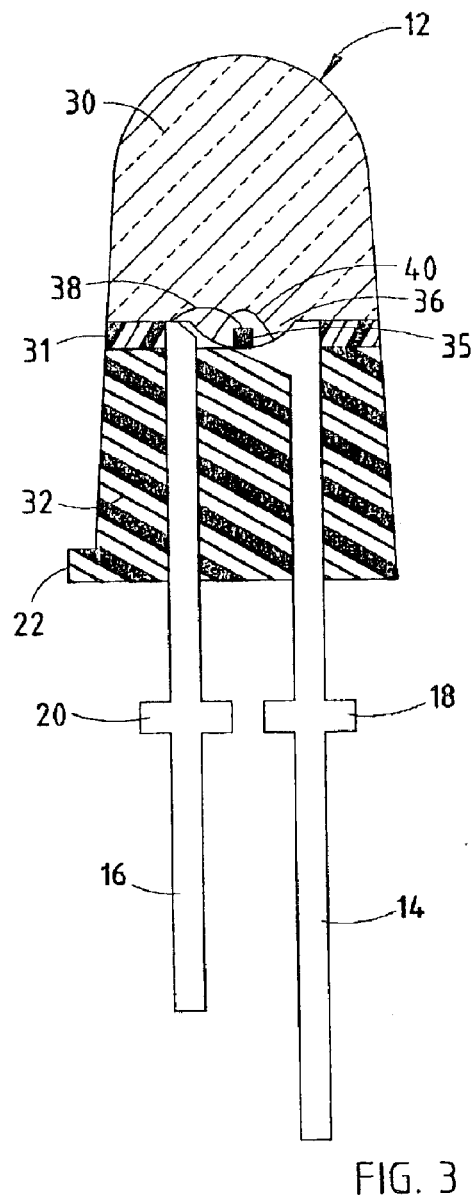
FIG. 3 is a cross-sectional view of the radiation emitter device shown in FIGS. 1 and 2 taken along line 3–3' as represented in FIG. 2.

FIGS. 1–3 show a radiation emitter device 10 constructed in accordance with a first embodiment of the present invention. As shown, radiation emitter device 10 includes an encapsulant 12, first and second electrical leads 14 and 16, and a radiation emitter 35. Encapsulant 12 encapsulates emitter 35 as well as a portion of each of electrical leads 14 and 16. Electrical leads 14 and 16 may have optional respective standoffs 18 and 20, which are provided to aid in the auto insertion of the device when constructed for THD applications.

As best shown in FIG. 3, an upper end of first electrical lead 14 extends horizontally outward and defines a reflective cup 36 on which radiation emitter 35 is preferably attached. Electrical connection of a first contact terminal of radiation emitter 35 to first electrical lead 14 may be made through a die-attach (not shown) or may be made by way of a wire bond or other connector. Device 10 further includes a wire bond 38 or other means for electrically coupling a second contact terminal of radiation emitter 35 to second electrical lead 16. The upper ends of first lead 14 and second lead 16 are electrically insulated from another by their spaced relation and by the fact that the encapsulant 12 is preferably made of a material having a relatively high electrical resistance.

The radiation emitter device 10 shown in FIGS. 1–3 is intended to have the same relative size and shape as a conventional 5 mm/T-1¾ LED device or 3 mm T-1 device, and accordingly, encapsulant 12 includes a lower rim 22 and a flat side 24, which facilitate registration of the radiation emitter device by an auto inserter.

As best shown in FIG. 3, an optional glob-top 40 or other optical or physical moderator is deposited over radiation emitter 35 and at least a portion of wire bond 38. Glob-top 40 may be made of silicone or silastic and may include an optional phosphor or other photoluminescent material. Use of a glob-top 40 is beneficial to help protect radiation emitter 35 and its connection to wire bond 38 during the molding processes. Other advantages of providing a glob-top 40 are discussed further below.

The encapsulant 12 of the inventive radiation emitter device 10 includes at least two functional zones 30 and 32 with a transition region 31 between zones 30 and 32. Two separate functional zones 30 and 32 are provided based upon the inventors' recognition that different portions of an encapsulant may serve different functions from other portions of the encapsulant such that the first zone 30 may have at least one different characteristic than the second zone 32 so as to optimize performance of the function(s) to be performed by that particular zone. For example, first zone 30 should be at least partially transmissive to the wavelengths of radiation emitted from radiation emitter 35, while second zone 32 need not be transparent to such wavelengths. This allows the radiation emitter device of the present invention to make use of the extraordinary benefits of high performance power semiconductor encapsulation and transfer-molding compounds in the second zone. These characteristics can include relatively low coefficient of thermal expansion; relatively high thermal conductivity; relatively high $T_g$; relatively high specific heat; relatively low permeability to oxygen, gas, or water vapor; and relatively high physical strength properties. The compounds used for packaging or potting many high-power non-optical electronic devices are superior by a large margin in many of these categories to those traditionally used for conventional opto-electronic emitters. One of the main reasons for the disparity is that the high performance materials under discussion are usually opaque mixtures—not transparent to the band of radiation emitted in discrete optoelectronic emitter devices. The opacity of these functionally attractive materials is intrinsically linked to their beneficial properties (by virtue of the performance-enhancing mineral, metal, and metal-oxide fillers, for example), and thus, these materials had not been previously considered for use in optoelectronic components due to their opacity. However, by limiting the use of such materials to a zone of encapsulant 12 that does not require transparency, the present invention enjoys all the benefits of these material characteristics.

First zone 30 of encapsulant 12 is preferably a substantially transparent material to preserve optical performance. First zone 30 may optionally be partially diffuse. First zone 30 may be made of any conventional transparent encapsulant commonly used for opto-electronic emitter devices. First zone 30 of lens 12 preferably covers, envelopes, protects, and supports radiation emitter 35, the die-attach (if present) and a portion of any wire bonds 38 connected to radiation emitter 35.

First zone 30 of encapsulant 12 may be comprised of two or more portions, with the innermost being a silicone or silastic glob-top 40 preapplied to radiation emitter 35 prior to the first stage of molding of the encapsulant of the present invention. This innermost portion of first zone 30 may alternately be a high performance epoxy, silicone, urethane, or other polymer material possibly including optically translucent or transparent fillers or diffusants.

First zone 30 of encapsulant 12 is preferably made of a composition comprising an optical epoxy mixture that is substantially transparent to the radiation emitted by radiation emitter 35. However, other clear materials may also be used, and the materials need not be transparent in bands outside the primary emission band of the radiation emitter.

Second zone 32 of encapsulant 12 is preferably made of a material that optimizes the function of that region of encapsulant 12. As noted above, second zone 32 need not be transparent. However, a specialized function of zone 32 is generally to minimize catastrophic failure, stress, and accumulated fatigue from mechanical stresses propagated up electrically conductive leads 14 and 16. Not only may a material that is better suited for this purpose be selected given that it need not be transparent, but also the material may have higher strength properties, including higher tensile and compressional strength, adhesion, and/or cohesion.

Another function served by second zone 32 of encapsulant 12 is to serve as a barrier to oxygen, molecular water vapor, or other reagents that may otherwise propagate upward into the device through second zone 32 or through the interface between leads 14 and 16 and encapsulant 12. Thus, second zone 32 should effectively protect radiation emitter 35, the die-attach (if present) wire bond 38, the encapsulated portions of the lead frame plating, and other internal device constituents including any photoluminescent material that may be present, from oxygen, molecular water vapor, and other reagents. Because second zone 32 of encapsulant 12 need not be transparent, second zone 32 may be constructed with improved barrier properties compared to those present in conventional transparent encapsulants.

Perhaps one of the more significant different characteristics that second zone 32 may have from first zone 30 is that it may have improved thermal characteristics. To achieve lower device thermal resistance, second zone 32 preferably has a high thermal conductivity, at least in the critical region of the device surrounding electrical leads 14 and 16 and in thermal coupling to the portion of the leads that supports radiation emitter 35 (i.e., reflective cup 36, if present). To preserve relatively high thermal resistance protection from soldering operations, the bottom portion of second zone 32 of encapsulant 12 extends no closer to the solderable portion or ends of electrically conductive leads 14 and 16 than the standoffs 18 and 20 (if present) or an equivalent point on the leads destined to remain substantially out of contact with molten solder during processing, if standoffs are not present.

By forming second zone 32 of encapsulant 12 to have a high heat capacity, second zone 32 will help suppress transient temperature spikes during processing or operation. Also, by configuring second zone 32 to have a low coefficient of thermal expansion, catastrophic failure, stress, and accumulated fatigue from thermal expansion and contraction within the device is minimized.

To achieve different functional characteristics for the first and second zones 30 and 32 of encapsulant 12, the two zones may have different physical properties. Such physical properties may be structural or compositional. Such different structural characteristics may be obtained using the same general composition for both first and second zones 30 and 32 but by causing a change in grain size or micro-structural orientation within the two zones. Such structural characteristics may be modified during the molding process by treating the zones differently by annealing, radiation curing, or other radiation treatment. Further, the micro-structural orientation may be changed by applying a magnetic field to one or more of the zones forming encapsulant 12.

In the event two different compositions are utilized to form first and second zones 30 and 32, it is preferable that the material compositions are compatible for molding in the same mold, as is discussed further below with reference to the inventive process for making a preferred embodiment of the present invention. By integrally molding first and second zones 30 and 32, a cohesive bond may be formed at transition 31 between zones 30 and 32. Such a cohesive bond is desirable to improve the strength of the encapsulant as a whole and to prevent oxygen, water vapor, or other reagents from reaching radiation emitter 35 via any interface between zones 30 and 32 that otherwise may be present. Further, such a cohesive bond provides continuity of the outer surface. As discussed further below, it is desirable that the compositions used for first and second zones 30 and 32 partially intermix at transition 31. Transition 31 may be a fairly narrow cross section of encapsulant 12 or may be broader and larger if a composition gradient is formed using the compositions of first and second zones 30 and 32.

An additional advantage of making second zone 32 of encapsulant 12 opaque is that any back-scattering from device 10 may be substantially reduced. Such backscattering may be a problem when a light sensor is mounted in the same housing as radiation emitting device 10, as is often the case when such radiation emitter devices are mounted in an electrochromic rearview mirror assembly for an automobile.

Having described the general physical structure of the radiation emitting device of the present invention, an inventive method for making such a radiation emitter device is described below. It will be appreciated, however, that radiation emitter device 10 may be made using other methods.

Figure 4:
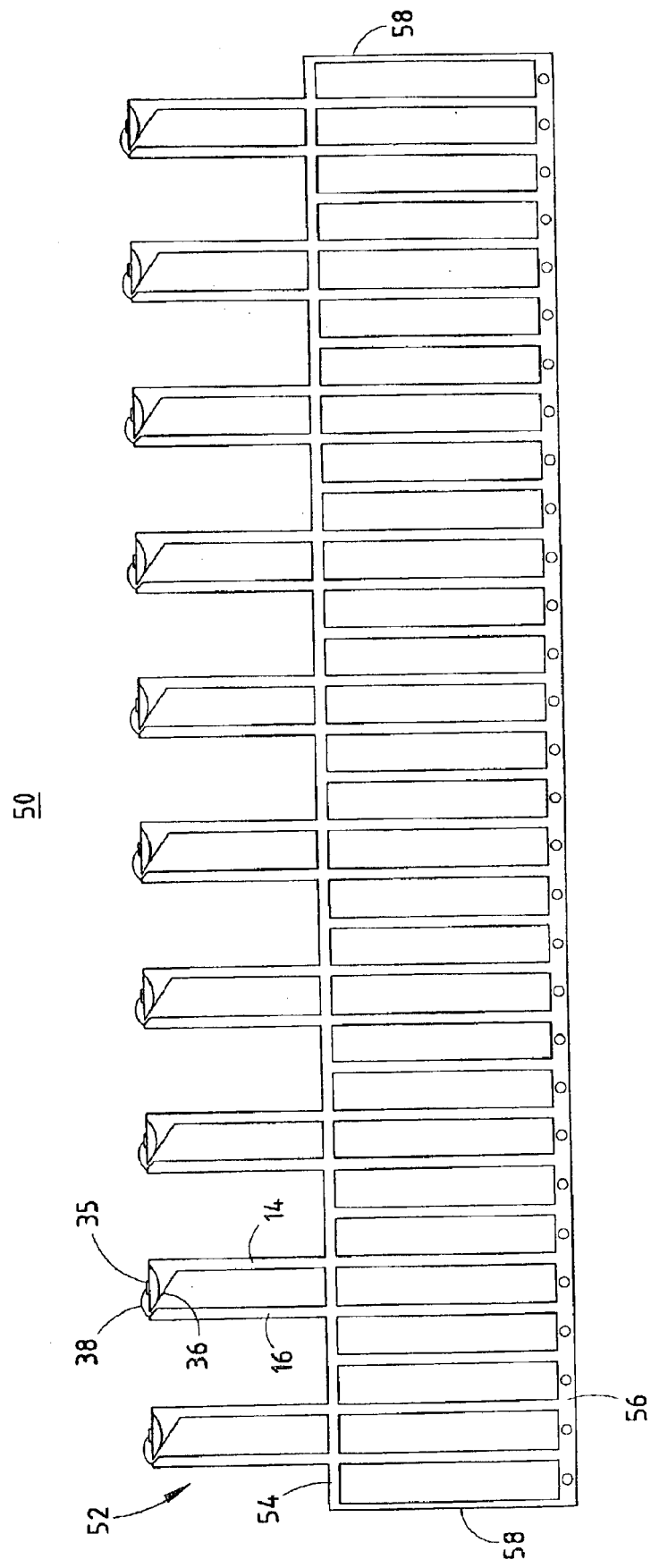
FIG. 4 is a side view of a lead frame subassembly from which radiation emitter device shown in FIGS. 1–3 may be constructed.
Figure 9:
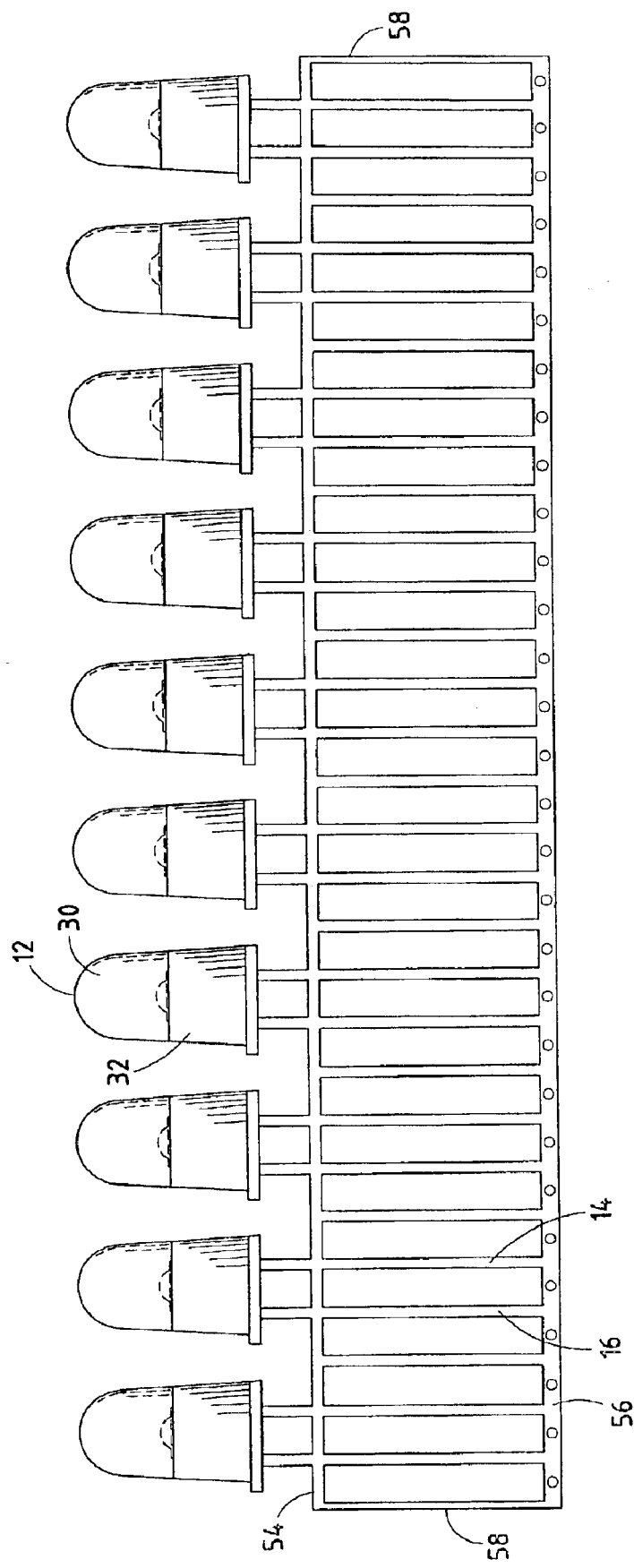
FIG. 9 is a side view of the final lead frame assembly following removal from the mold.
Figure 10:
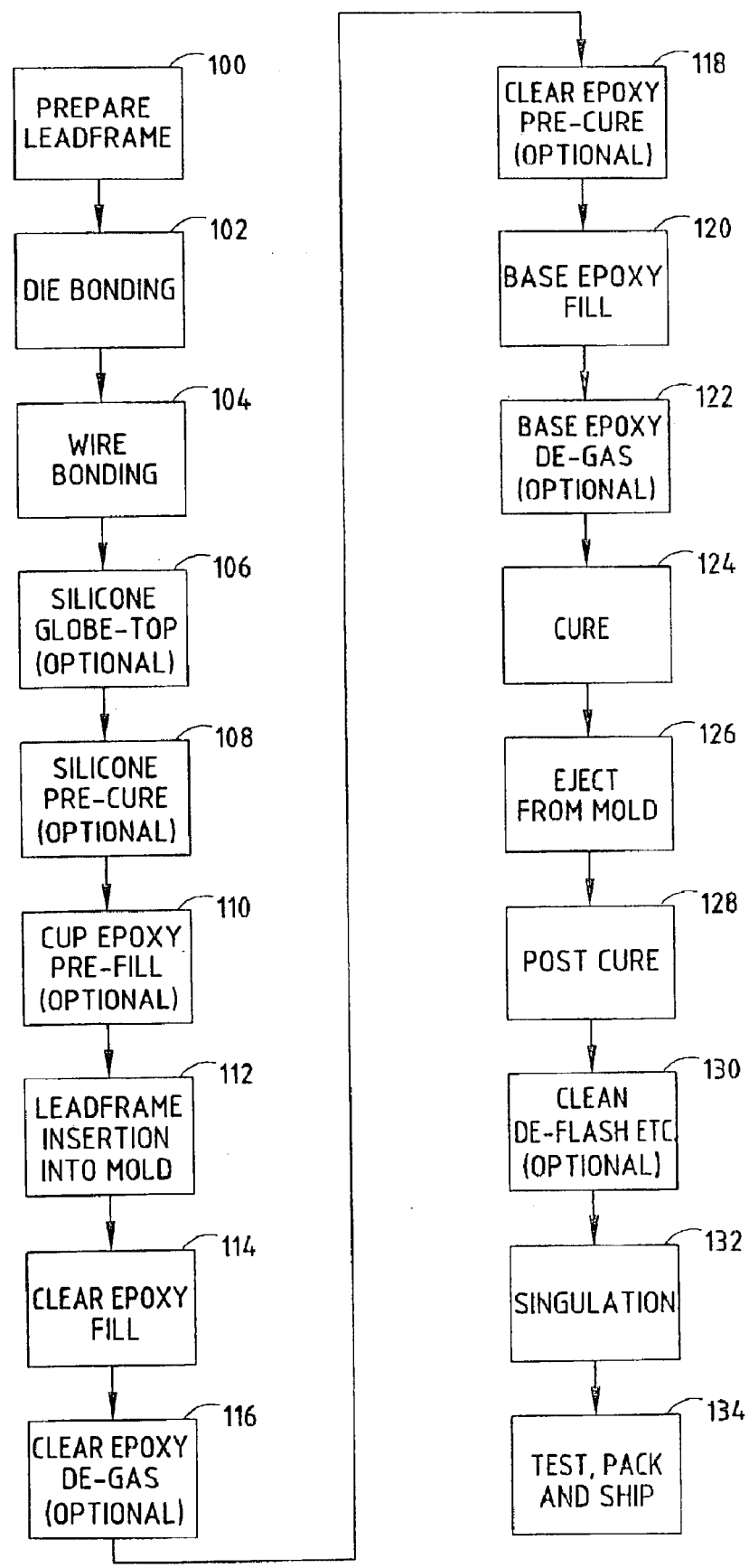
FIG. 10 is a flow chart showing the steps of the inventive method for producing radiation emitter devices in accordance with the present invention.

FIG. 10 shows a flowchart showing the steps and optional steps for the inventive method. Reference will be made to FIG. 10 simultaneously with references to FIGS. 4–9, which show various stages of the device assembly. The first step 100 in the inventive method is to prepare a lead frame. An example of a lead frame is shown in FIG. 4 and is designated with reference numeral 52. The lead frame may be made in any conventional configuration using any conventional techniques. Lead frame 52 is preferably made of metal and may be stamped and optionally post-plated. Lead frame 52 may also undergo optional ultrasonic or other cleaning. As shown in FIG. 4, lead frame 52 includes the first and second electrically conductive leads 14 and 16 for a plurality of radiation emitter devices. Leads 14 and 16 are held together by a first tie bar 54 and by a second tie bar 56 that extend substantially perpendicularly to leads 14 and 16. Lead frame 52 may further include vertical frame members 58 that extend between first and second tie bars 54 and 56 at both ends of lead frame 52 and between pairs of leads 14 and 16.

Lead frame 52 is also preferably shaped to include a support (preferably a reflective cup 36) at one end of first electrical lead 14. Reflective cup 36 may be polished or plated to increase its reflectivity.

The next step in the process (step 102) is to attach one or more radiation emitter 35 to each reflective cup 36 on lead frame 52. In the most preferred embodiment, radiation emitters 35 are LED chips and are die-bonded with conductive epoxy attach or eutectic bond into/onto each cup 36 or other support structure in the lead frames. The LED chips, if used, may be any conventional LED chip or any LED chip or other radiation emitter subsequently developed. As part of this step, the attach epoxy may optionally be degassed by vacuum and then cured/cooled. This structure may then optionally be subjected to ultrasonic or other cleaning following the above steps.

For the most preferred embodiment, radiation emitters 35 are then wire-bonded with bond wire to establish the desired conductive path for radiation emitter 35 (step 104). Then, in step 106, an optional phosphor, glob-top, or other optical or physical moderator is then deposited on radiation emitter 35. Note that more than one such optical or physical moderator may be used (e.g., a phosphor can first be applied and cured/dried followed by a silicone glob-top application). Whatever is applied at this stage is normally then dried and cured (step 108). Optionally, any such optional optical or physical moderator may be degassed by vacuum prior to proceeding to the next step.

The next step (step 110) involves the optional application of a clear epoxy within the reflective cup 36 followed by an optional degassing step, which may be performed by vacuum. This optional application of clear epoxy may be performed to prevent bubbles from forming in and around the reflective cup during the subsequent molding operation. The clear epoxy applied may be the same material that is applied during the first molding stage described further below. Following step 110, the construction of lead frame subassembly 50 (FIG. 4) is complete and such subassembly is ready for molding.

Figure 5:
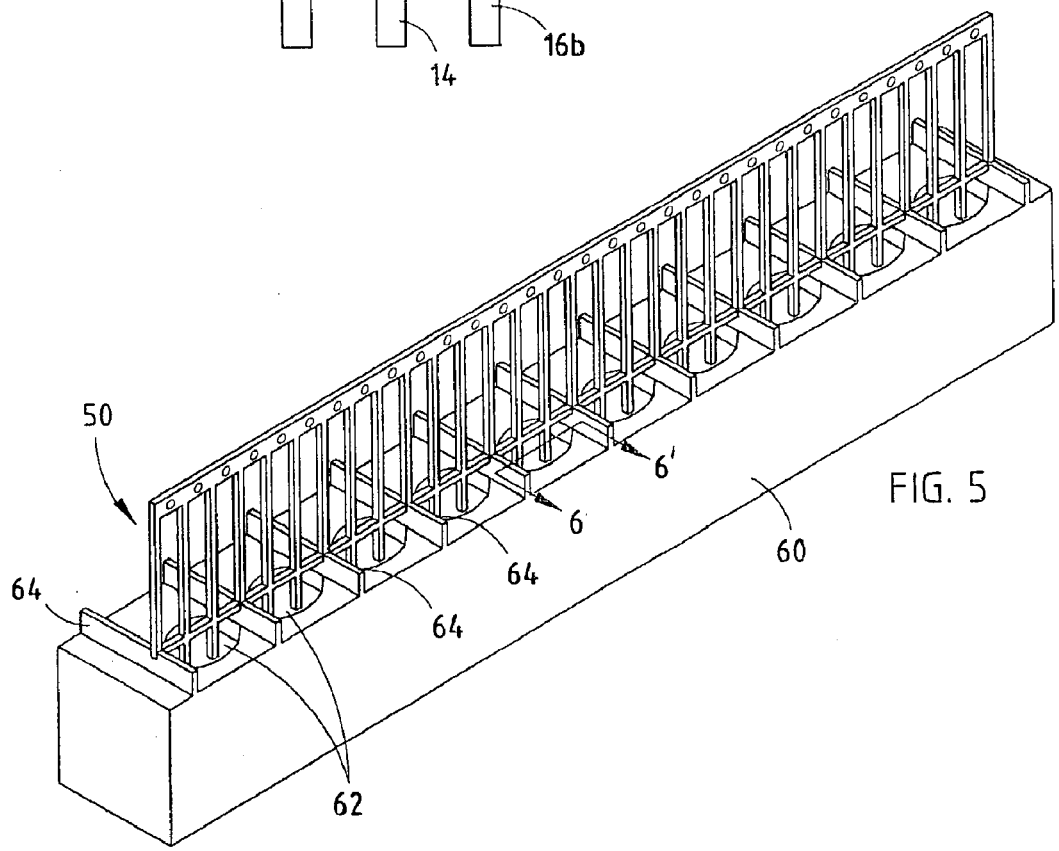
FIG. 5 is a perspective view of the lead frame subassembly shown in FIG. 4 inverted and inserted into a mold in accordance with the inventive method for making radiation emitter devices.
Figure 6:
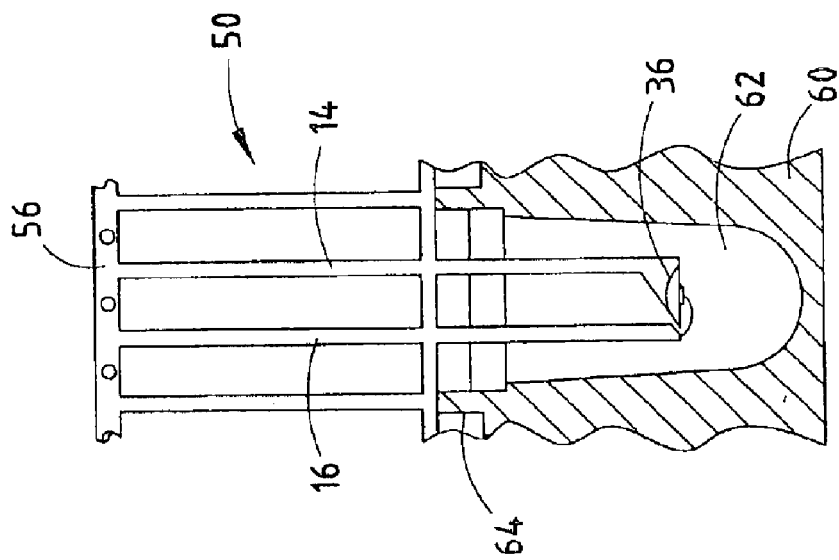
FIG. 6 is a partial cross-sectional view taken along line 6–6' in FIG. 5, which shows a portion of the lead frame subassembly inverted and inserted into the mold shown in FIG. 5 prior to a first molding step.

The next step (step 112) is thus to invert lead frame subassembly 50 and insert and register portions of the lead frame subassembly into encapsulation mold cavities 62 formed in a mold 60. As shown in FIG. 5, the mold preferably includes a plurality of lead frame supports 64 for receiving and registering lead frame subassembly 50 in a proper position relative to mold cavities 62. FIG. 6 shows a cross-sectional view of one such mold cavity 62 with a corresponding portion of lead frame subassembly 50 inverted and inserted into cavity 62.

The next step (114) is to perform the first stage of encapsulation whereby a clear epoxy lens material is dispensed (preferably by injection) into encapsulant mold cavity 62. Precise metering or feedback is preferably used to fill the clear epoxy just up to or over the inverted lip of the reflective cup 36 or surfaces of the radiation emitter 35, if for some reason there is no reflective cup in the device. See, for example, FIG. 7. Next, an optional degas step (step 116) is performed to remove bubbles by vacuum from the clear epoxy. A step (118) of precuring the clear epoxy may then optionally be performed. This optional precure may be just enough of a cure to minimize free mixing of the two primary encapsulation materials, but also be not so much as to prevent some mixing. Some minor mixing in the transition boundary 31 is believed to be good for homogenous strength, cohesive bonding, etc.

Figure 8:
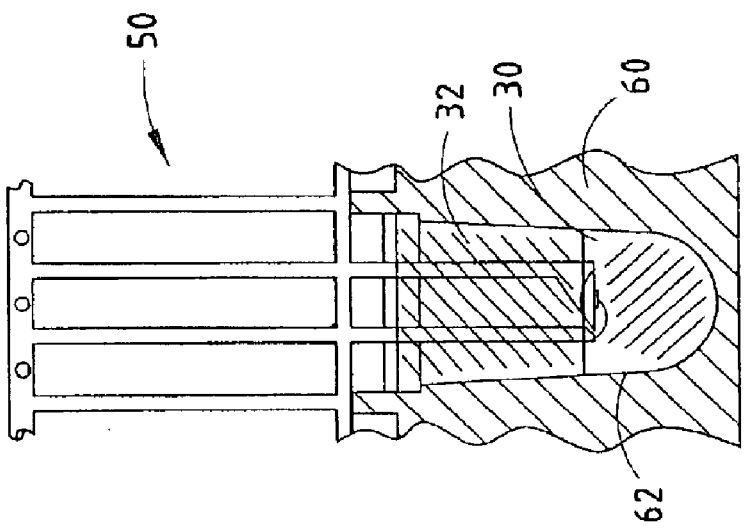
FIG. 8 is a partial cross-sectional view taken along line 6–6' in FIG. 5, which shows a portion of the lead frame subassembly inverted and inserted into the mold shown in FIG. 5 after a final molding step.
Figure 7:
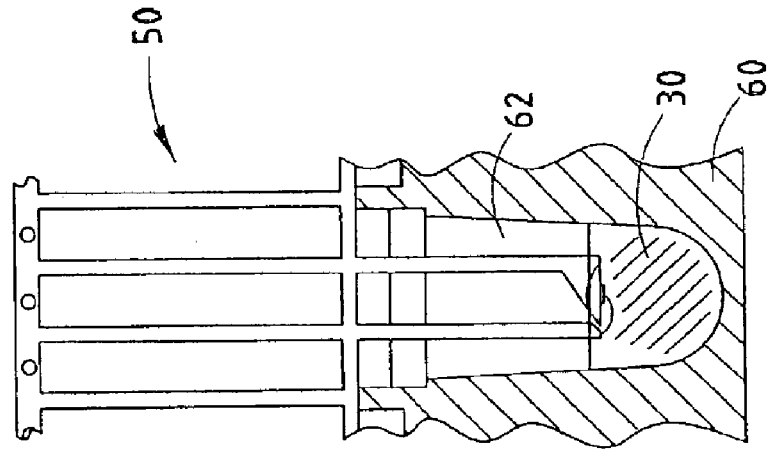
FIG. 7 is a partial cross-sectional view taken along line 6–6' in FIG. 5, which shows a portion of the lead frame subassembly inverted and inserted into the mold shown in FIG. 5 after a first molding step.

The next step (step 120) is to perform the second stage of encapsulation molding in which a base epoxy is dispensed within mold cavity 62 (preferably by injection) so as to fill the remainder of mold cavity 62. Precise metering or feedback is preferably used to fill just up to the designed bottom of the device body or the top of standoffs 18 and 20, if present. FIG. 8 shows an appropriate filled mold cavity 62 following the second stage.

After step 120, step 122 is optionally performed whereby the base encapsulation material is degassed by vacuum to remove any bubbles.

Then, in step 124, the base encapsulation material is cured along with any residual curing of any other previously in-place materials that are not yet fully cured. Next, in step 126, the nearly finished lead frame structure is ejected from mold 60. An optional post-cure step 128 may then be performed followed by an optional cleaning/deflash step 130. The resultant structure is shown in FIG. 9.

The next step is a singulation step 132 whereby second tie bar 56 and vertical lead frame members 58 are cut away from the finished lead frame assembly and first tie bar 54 is cut between first and second electrical leads 14 and 16 for each device as well as between each device. If standoffs are not desired, first tie bar 54 may be removed in its entirety, otherwise the portions of tie bar 54 that remain may serve as standoffs 18 and 20.

After the singulation step 132, an optional testing step 134 may be performed and the device may then be packed and shipped. Variations of this method are discussed below with reference to the alternative embodiments of the invention.

Figure 11:
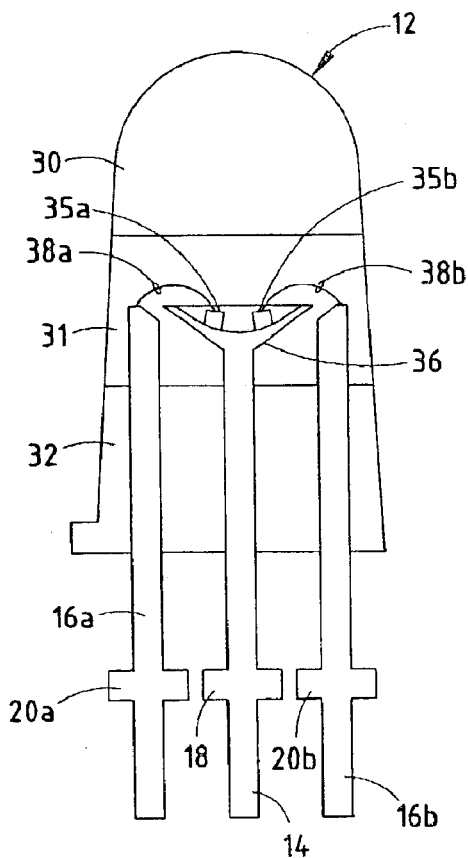
FIG. 11 is a cross-sectional view of a radiation emitter device constructed in accordance with a second embodiment of the present invention.

FIG. 11 shows a radiation emitter device 150 constructed in accordance with a second embodiment of the present invention. Device 150 differs from device 10 discussed above in that it includes a plurality of radiation emitters 35a and 35b. Both emitters 35a and 35b may be mounted in a common reflective cup 36 or may be mounted in separate cups provided on the same or separate leads. Depending upon the electrical connection and control desired, an additional lead 16b may be provided. Radiation emitters 35a and 35b may be connected in series or in parallel and may be identical or have different constructions so as to emit light of different wavelengths. In one preferred embodiment, emitters 35a and 35b emit light of a binary complementary nature to produce effective white light. LED chips and devices suitable for such application are disclosed in commonly assigned U.S. Pat. No. 5,803,579 entitled "ILLUMINATOR ASSEMBLY INCORPORATING LIGHT EMITTING DIODES," filed on Jun. 16, 1996, by Robert R. Turnbull et al. The entire disclosure of this patent is incorporated herein by reference.

The base epoxy used to form second zone of encapsulant 12 may be distinct from the clear lens epoxy used to form first zone 30 not only in composition, but additionally or alternatively distinct in one or more physical properties (spectral transmittance at a wavelength of interest, diffuse scattering properties at one or more wavelengths of interest, microcrystalline structure, strength, thermal conductivity, $CT_E$, $T_g$, etc.). The transition zone 31 between first zone 30 and second zone 32 may occur at a transition boundary zone 31, which may be narrow (effecting a more abrupt transition in properties) or broad (effecting a more gradual transition or gradient in properties). As discussed above, the distinction between lens epoxy and base epoxy may be compositional and achieved by using two different material mixtures in the manufacturing process. A narrow transition boundary zone 31 between zones 30 and 32 might then be achieved by ensuring two formulations that are substantially immiscible or by slightly or completely precuring one material before the other is added. A broad boundary zone 31 might be achieved by not precuring the first material completely prior to adding the second material and by ensuring the formulae of the two materials allow some mixing at their boundary.

In the event that a distinction desired between lens epoxy and base epoxy is not primarily a compositional distinction, but rather a physical distinction, then alternate means may be used to accomplish this, if the above-noted means is insufficient. For example, material property enhancement to a compositionally identical base epoxy portion may be achieved by post-treating the base epoxy portion after dispensing into the mold. Such post-treatment may be differential heating (such as by having established a temperature gradient in the mold or by using a stratified oven or stratified heated airflow). Such pretreatment may additionally or alternatively be differential irradiation with zonal IR, UV, visible, microwave, X-ray, or other electromagnetic radiation source or by E-beam or other particle beam. Also, certain microstructural effects (grain migration, lamination, orientation, size, agglomeration, etc.) may be effected by exposing all or part of the device materials to electric fields, magnetic fields, centrifugal/centripetal forces or gravity before, during, or after dispensing.

Figure 12:
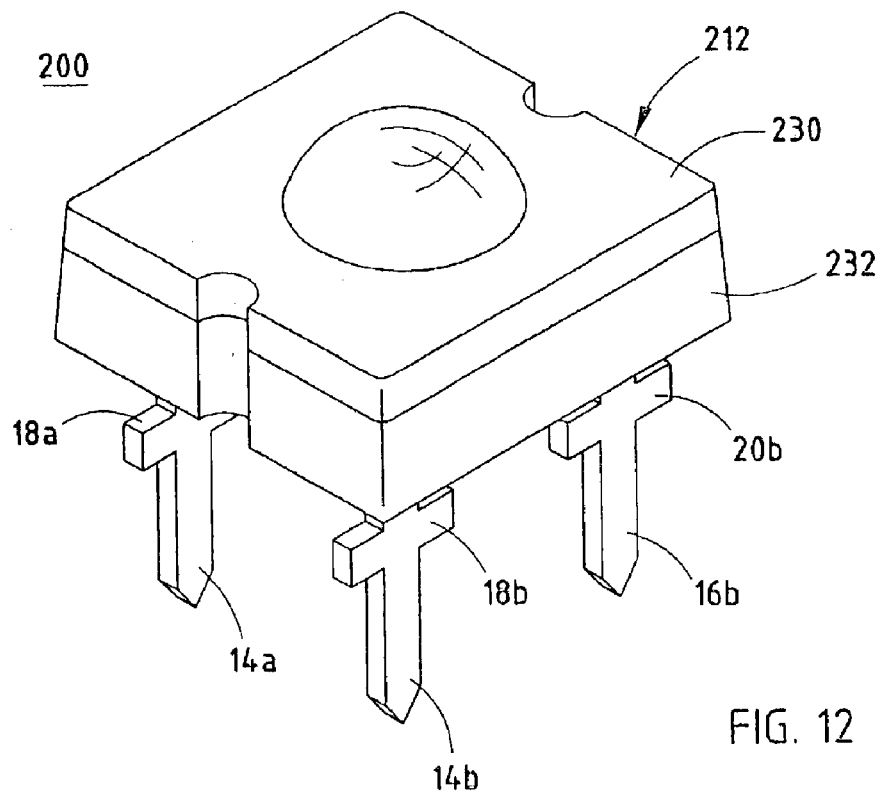
FIG. 12 is a perspective view of a radiation emitter device constructed in accordance with a third embodiment of the present invention.

FIG. 12 shows a radiation emitter device constructed in accordance with a third embodiment of the present invention. The device 200 shown in FIG. 12 is configured to have the same size and shape as Hewlett Packard's SuperFlux or Piranha devices. As shown, device 200 differs, however, in that it incorporates an encapsulant 212 having a first zone 230 and a second zone 232 applied in a similar manner as applied in the first two embodiments.

Figure 13:
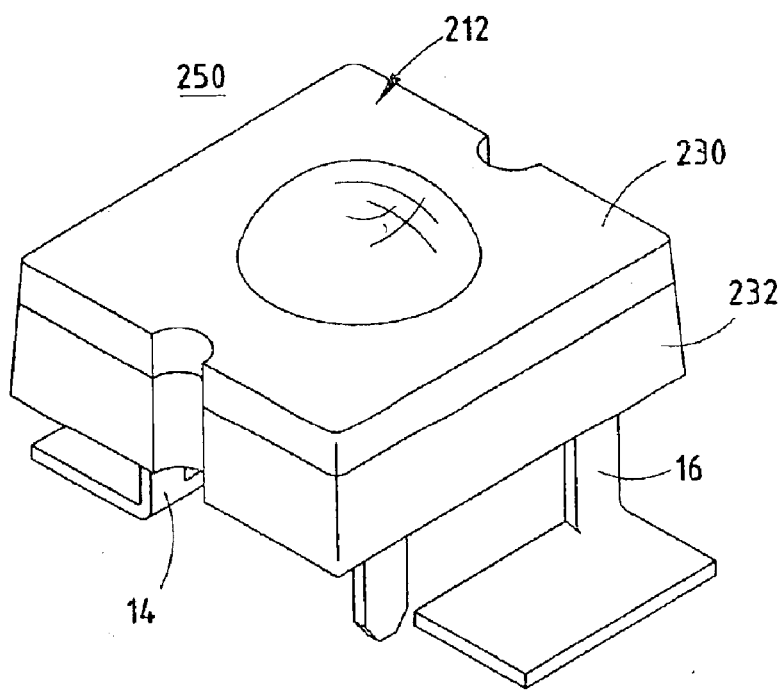
FIG. 13 is a perspective view of a radiation emitter device constructed in accordance with a fourth embodiment of the present invention.
Figure 14:
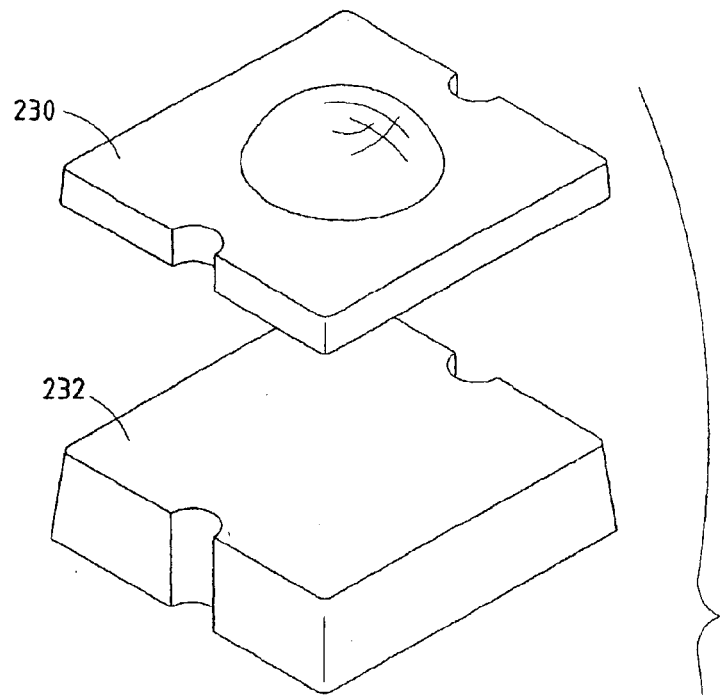
FIG. 14 is an exploded perspective view of the radiation emitter device shown in FIG. 13.
Figure 14:
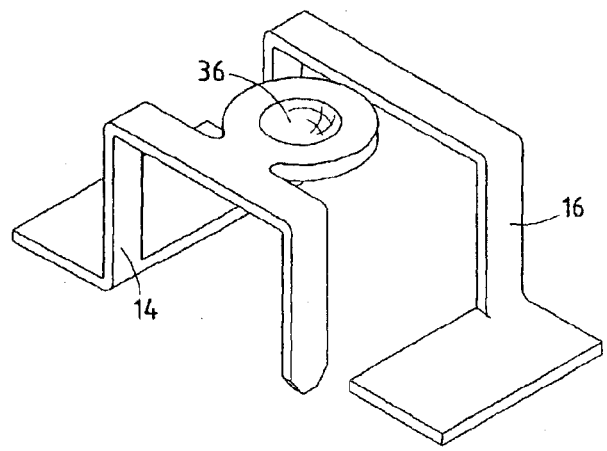

FIGS. 13 and 14 show a radiation emitter device 250 constructed in accordance with a fourth embodiment of the present invention. As apparent from FIGS. 13 and 14, this fourth embodiment is intended to resemble, in both size and shape, the configuration of Hewlett Packard's SnapLED device. By configuring various embodiments of the invention to resemble conventional products in size and shape, the devices of the present invention may be readily substituted for the conventional devices without requiring any modification to equipment used to populate a circuit board. Additionally, by configuring these embodiments to resemble conventional structures, the same encapsulant mold cavities that are used to make the conventional devices may be used to make the inventive embodiments thereby eliminating the need to significantly modify the apparatus used to manufacture these radiation emitter devices.

Figure 15:
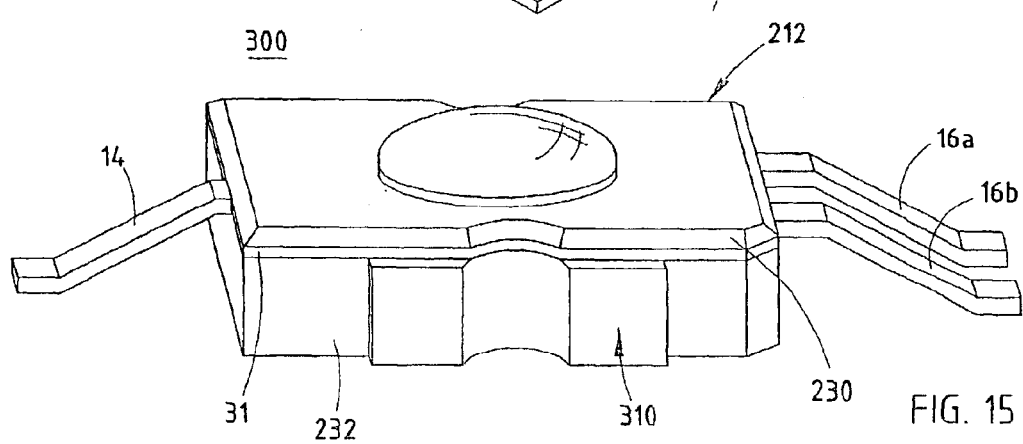
FIG. 15 is a perspective view of a radiation emitter device constructed in accordance with a fifth embodiment of the present invention.

FIG. 15 shows a radiation emitter device 300 constructed in accordance with a fifth embodiment of the present invention. Device 300 includes an additional heat extraction member 310 that extends outward from the encapsulant separate and apart from the electrical leads. Other suitable constructions utilizing a heat extraction member are disclosed in commonly assigned above-referenced U.S. Pat. No. 6,335,548, the entire disclosure of which is incorporated herein by reference.

With the construction shown in FIG. 15, it may be desirable to form a micro-groove lens, such as a Fresnel lens directly in the encapsulant. This is particularly advantageous when LED chips of different colors are provided in a single discrete LED device where the light from the chips is to mix to form another color such as white light. A reflective element may also be secured to the light output surface of the device to further modify the light emitted from the device. An example of an LED device having a micro-groove lens and such a reflective element is disclosed in commonly assigned U.S. Patent Application No. 60/270, 054, entitled RADIATION EMITTER DEVICE HAVING A MICRO-GROOVE LENS, filed on Feb. 19, 2001 by John K. Roberts, the entire disclosure of which is incorporated herein by reference.

The invention will be further clarified by the following example, which is intended to be exemplary of the invention and is not intended in any manner to limit the invention.

EXAMPLE

Figure 16:
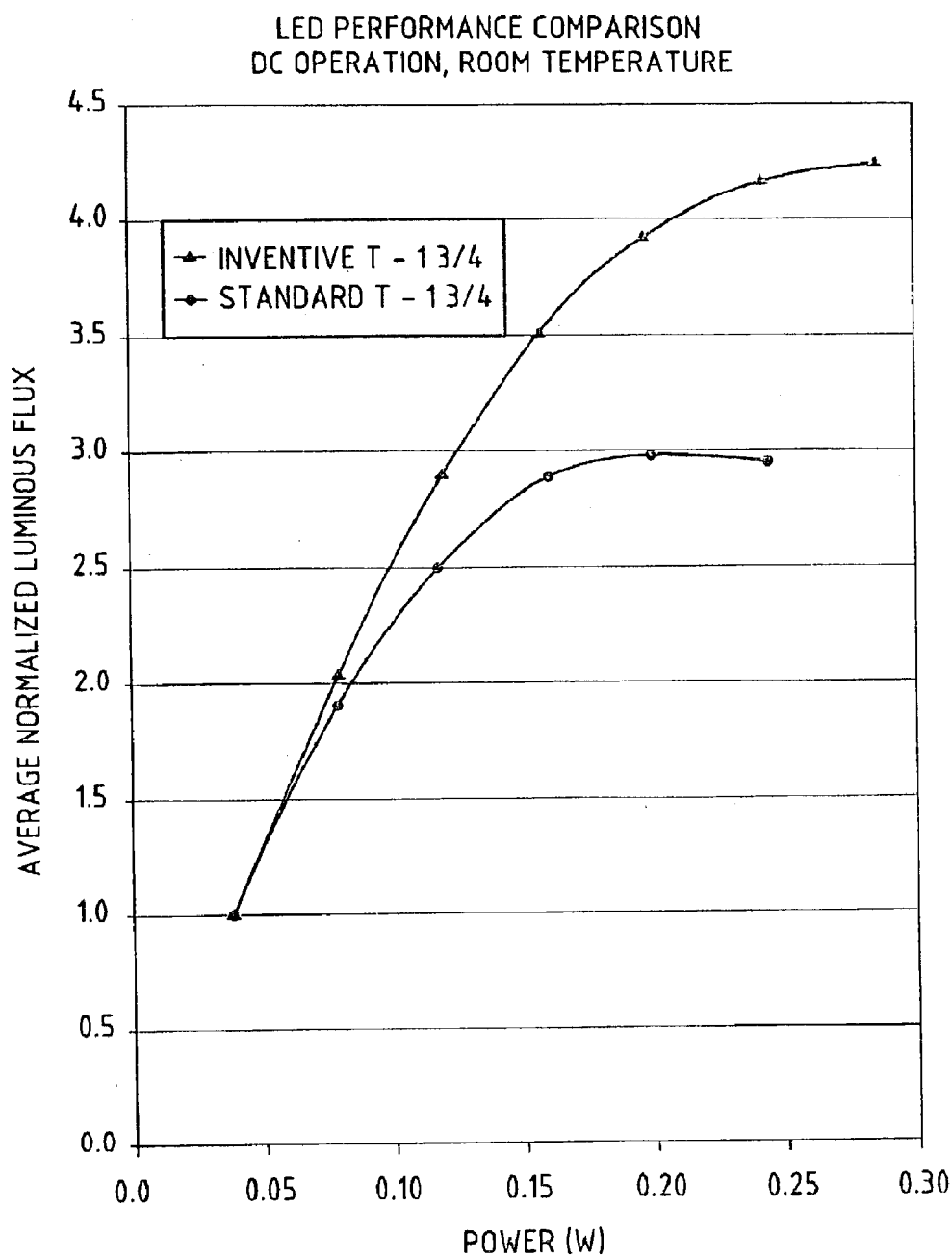
FIG. 16 is a graph showing the average normalized luminous flux as a function of applied power for a conventional T-1¾ LED device and for the inventive T-1¾ LED device shown in FIGS. 1–3.

To demonstrate the effectiveness of the present invention, two LED devices were constructed and tested. The first LED device was a conventional T-1¾ LED device, while the second LED device had an identical construction with the exception that encapsulant 12 included a second zone 32 as disclosed above with respect to the first embodiment of the present invention. The conventional T-1¾ LED device was constructed using HYSOL® OS4000 transparent epoxy available from Dexter Electronic Materials Division. The inventive T-1¾ LED device was constructed using the same transparent epoxy for first zone 30. The second zone 32, however, was formed using HYSOL® EO0123 casting compound, which is also available from Dexter. The two LED devices were then operated by DC operation at room temperature, and their average normalized luminous flux was measured and plotted in the graph shown in FIG. 16. As apparent from this graph, the inventive LED device had much greater luminous flux, particularly at higher powers.

It should be understood that, for this sample, increased illuminance at each indicated power level for the inventive LED device relative to the conventional LED device is an indication of reduced junction operating temperature and reduced assembly thermal resistance.

While the present invention is generally described as employing two or three zones in the encapsulants that are arranged substantially vertically when the primary optical axis of the device is vertical, it will be appreciated that the zones may be oriented with respect to each other to the left or right of the central optical axis or one inside or outside the other. Such an inside/outside arrangement of the encapsulant zones may be affected by achieving a "cure gradient" from the outside to the inside whereby the inside is not fully cured and is left soft for a while into the life of the radiation emitter device. Such a configuration may also be used by curing the inside of the LED using the heat generated by the radiation emitter 35 itself, This may be advantageous when low residual mechanical stress is desired.

In certain embodiments of the present invention, thermal resistance from the radiation emitter junction to the ambient environment is reduced without reducing thermal resistance (junction to lead), and therefore, better operating temperature (i.e., lower operating temperature) at a given power may be achieved without increased susceptibility to lead-soldering thermal damage.

The above description is considered that of the preferred embodiments only. Modifications of the invention will occur to those skilled in the art and to those who make or use the invention. Therefore, it is understood that the embodiments shown in the drawings and described above are merely for illustrative purposes and not intended to limit the scope of the invention, which is defined by the following claims as interpreted according to the principles of patent law, including the doctrine of equivalents.

The invention claimed is:

1. A method of making a radiation emitting device comprising the steps of:
   attaching and electrically coupling at least one radiation emitter to a lead frame to form a subassembly;
   inserting said subassembly into a mold cavity;
   partially filling the mold cavity with a first encapsulant material;
   filling the remainder of the mold cavity with a second encapsulant material; and
   removing the encapsulated subassembly from the mold cavity.

2. The method of claim 1 further comprising the step of applying a glob top to said at least one radiation emitter prior to inserting said subassembly into a mold cavity.

3. The method of claim 1 further comprising the step of partially curing the first encapsulant material before filling the remainder of the mold cavity with the second encapsulant material.

4. The method of claim 1 and further including the step of curing the first and second encapsulant materials before removing the encapsulated subassembly from the mold cavity.

5. The method of claim 1 wherein the first encapsulant material is substantially transparent to radiation emitted by the radiation emitter.

6. The method of claim 1 wherein said second encapsulant material is opaque.

7. A radiation emitter method of manufacture comprising the steps of:
   providing at least one subassembly comprising a lead frame and at least one radiation emitter electrically connected to said lead frame;
   encapsulating a first portion of said subassembly with a first encapsulant material; and
   encapsulating a second portion of said subassembly with a second encapsulant material having at least one different characteristic than said first encapsulant material, wherein said at least one different characteristic is selected from the group comprising: cohesion, mechanical compression strength, mechanical tensile strength, thermal conductivity, specific heat, coefficient of thermal expansion, adhesion, oxygen permeability, gas permeability, moisture permeability, transmittance, glass transition temperature and microcrystalline structure.

8. The method of claim 7 wherein said at least one different characteristic is thermal conductivity.

9. The method of claim 7 further comprising the step of applying a glob top to said at least one radiation emitter prior to encapsulating said at least one radiation emitter.

10. The method of claim 7 wherein the first encapsulant material is substantially transparent to radiation emitted by the radiation emitter.

11. The method of claim 7 wherein said second encapsulant material is opaque.

12. A radiation emitter method of manufacture comprising the steps of:
   providing a plurality of interconnected subassemblies, each subassembly comprising a lead frame and at least one radiation emitter electrically connected to said lead frame;
   encapsulating a first portion of said subassemblies with a first encapsulant material; and
   encapsulating a second portion of said subassemblies with a second encapsulant material having at least one different characteristic than said first encapsulate material.

13. The method of claim 12 further comprising the step of applying a glob top to said at least one radiation emitter prior to encapsulating said at least one radiation emitter.

14. The method of claim 12 further comprising the step of singulation of said subassemblies subsequent to encapsulating said first and second portions.

15. The method of claim 12 wherein the first encapsulant material is substantially transparent to radiation emitted by the radiation emitter.

16. The method of claim 12 wherein said second encapsulant material is opaque.

* * * * *